United States Patent [19]

Schmoock

[11] Patent Number: 5,223,307
[45] Date of Patent: Jun. 29, 1993

[54] PACKAGING FOIL, AND METHOD FOR THE PRODUCTION THEREOF

[76] Inventor: Helmuth Schmoock, Büchener Weg 121, D-2058 Lauenburg/Elbe, Fed. Rep. of Germany

[21] Appl. No.: 837,585

[22] Filed: Feb. 18, 1992

Related U.S. Application Data

[60] Continuation of Ser. No. 590,507, Sep. 26, 1990, abandoned, which is a continuation of Ser. No. 300,268, Jan. 23, 1989, abandoned, which is a division of Ser. No. 897,638, Jul. 25, 1986, Pat. No. 4,818,609.

[30] Foreign Application Priority Data

Nov. 28, 1984 [DE] Fed. Rep. of Germany ....... 3443319
Nov. 28, 1985 [WO] PCT Int'l Appl. .................. PCT/EP85/00651
Mar. 12, 1986 [IN] India ............................ 187/CAL/86
Mar. 20, 1986 [PH] Philippines ............................... 33563

[51] Int. Cl.5 ............................................. B05D 5/00
[52] U.S. Cl. .................................. 427/471; 427/177; 427/209; 427/210; 427/600
[58] Field of Search ............ 427/209, 210, 177, 255.6, 427/124, 131, 132, 251, 255.7, 471, 600

[56] References Cited

U.S. PATENT DOCUMENTS

| | | | |
|---|---|---|---|
| 4,520,070 | 5/1985 | Yamamoto et al. | 427/130 X |
| 4,581,245 | 4/1986 | Nakamura et al. | 427/130 X |
| 4,619,869 | 10/1986 | Kiriyama et al. | 428/694 X |
| 4,645,703 | 2/1987 | Suzuki et al. | 427/128 X |

FOREIGN PATENT DOCUMENTS 936691 9/1963 United Kingdom ............... 427/124

Primary Examiner—Michael Lusigan
Attorney, Agent, or Firm—Peter K. Kontler

[57] ABSTRACT

A foil has two essentially plane parallel surfaces of which at least one is at least partially covered by a metallic layer. The surface of the metallic layer is protected by an antifriction film. The surface opposite the metal-coated surface of the foil can likewise be protected by an antifriction film. The antifriction film or films should have a uniform thickness of at most 0.5 micron. The antifriction film or films can be vapor deposited, rolled or sprayed on to the foil or distributed on the foil ultrasonically or electostatically. The foil is subsequently wound into a roll.

7 Claims, 3 Drawing Sheets

5,223,307

PACKAGING FOIL, AND METHOD FOR THE PRODUCTION THEREOF

This application is a continuation of application Ser. No. 590,507, filed Sep. 26, 1990, now abandoned, which is a continuation of application Ser. No. 300,268, filed Jan. 23, 1989, now abandoned which is a division of application Ser. No. 897,638, filed Jul. 25, 1986, now U.S. Pat. No. 4,818,609, granted Apr. 4, 1989.

BACKGROUND OF THE INVENTION

The invention relates to a foil having two essentially plane parallel surfaces of which at least one is at least partially covered by a metallic layer.

Such foils are frequently used in modern packing technology. They are capable of imparting particularly good sales appeal to the packed goods. As the surface quality improves, it becomes easier to sell a good in a large number of outlets. Particularly in the food trade, customers are especially fond of goods which are surrounded by a foil having high surface quality. Furthermore, foils of this type are used for the production of decorations and displays. The drawback of such foils is that the surface quality frequently suffers during processing of the foil. In particular, the surface can be damaged in the processing machines by scratching. Scratches can, however, already affect the surface quality during manufacture of the foil. For example, it has been found that the surface quality suffers when the foil is coiled into rolls. When coiling the foil, the individual convolutions of a roll can press against one another so hard that the individual convolutions are influenced by neighboring convolutions. Thus, relative shifting of the individual convolutions, e.g., due to increases in length, which can cause scratches, occurs within the roll at very high pressure, e.g. These scratches frequently not only affect the appearance of the surface but also degrade the mechanical properties of the surface.

OBJECTS AND SUMMARY OF THE INVENTION

It is accordingly an object of the present invention to improve a foil of the above type in such a manner that it retains a largely uniform surface quality even when it is subjected to mechanical loads.

In accordance with the invention, this object is achieved in that the surface of the metallic layer is protected by an antifriction film.

This antifriction film does not only keep a variety of mechanical loads away from the surface. It is further adapted to form a lubricating layer on which a load acting upon the surface slides, particularly when the surface is loaded areally. The objects constituting a load remain in the region of sliding friction so that scratching of the surface is prevented. In this manner, the antifriction film constitutes a lubricant which distributed itself over the entire surface and prevents direct loading of the surface. The great advantage of the antifriction film resides in that the antifriction medium which forms the antifriction film adheres to the objects constituting the load. In this manner, it is assured that a lubricating layer which prevents direct loading of the surface protected by the antifriction film is present between the objects and the surface protected by the antifriction film.

According to a preferred embodiment of the invention, the surface opposite the metal-coated surface is protected by an antifriction film. This antifriction film is capable of being at least partially transferred to the metal-coated surface as soon as these two surfaces contact one another. Such contact occurs at the latest upon coiling of the foil when the metal-coated surface lies against that surface of the neighboring convolution which is provided with the antifriction film. In this manner, a homogeneous antifriction film is produced which prevents the external appearance of the metallic surface from being affected by scratches. Moreover, the mechanical properties of the metallic layer are prevented from being affected by scratches. Such scratches cause the mechanical strength of the metallic layer to be reduced. In addition, they can become permeable to gases.

The invention further relates to a method of establishing protection for a foil having a metallic layer on at least one of its surfaces.

In methods of this type, the surfaces are frequently provided with a coating having great surface strength. This coating possesses the drawback of having a relatively easily scratched surface as is the case, for example, with metal-coated surfaces which are provided with a lacquer coating. The entire surface of the foil therefore becomes dull with increased scratching of the coating. Moreover, such coatings can be damaged to such an extent by mechanical loading that they develop cracks. These cracks affect the mechanical strength of the entire foil. The latter loses strength.

It is accordingly another object of the present invention to so improve this method that foils with lasting surface quality and with surfaces having good mechanical properties are obtained.

In accordance with the invention, this object is achieved in that the metallic layer is covered with an antifriction film.

The antifriction film is applied to the surface in a simple manner without any effect on the brilliance of the surface by the resulting coating. The antifriction film remains transparent even under heavy mechanical loading so that the brilliance of the surface does not suffer. Finally, the antifriction film causes sliding friction to exist between the surface coating thereby and an areal load. The sliding friction prevents areal loading of the surface with the result that scratches on the protected surface are avoided.

According to a preferred embodiment of the invention, the antifriction film is vapor deposited on the metal-coated surface of the foil. Vapor deposition of the antifriction film allows the latter to be uniformly distributed over the entire surface in a very small thickness. The distribution of the antifriction film in a small thickness is adequate to provide lasting protection for the surface. On the other hand, the thinly deposited film cannot affect the appearance of the surface.

Additional features of the invention will be apparent from the following detailed description and the appended drawings which illustrate preferred embodiments of the invention by way of example.

DESCRIPTION OF THE PREFERRED EMBODIMENTS

Figure 1:
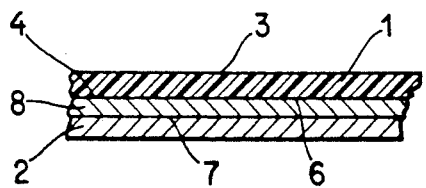
FIG. 1 is a section through a foil provided with an antifriction film.
Figure 2:
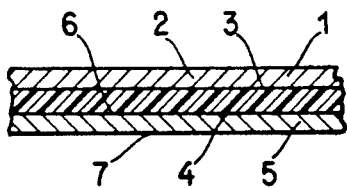
FIG. 2 is a section through another foil provided with an antifriction film.
Figure 3:
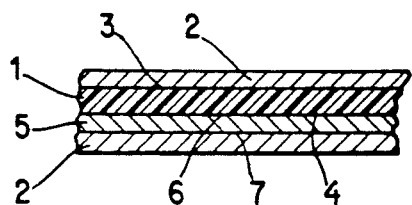
FIG. 3 is a section through a foil having a vapor deposited antifriction film on both sides.

A foil according to the invention consists essentially of a carrier material or substrate 1, a metallic layer 5 and an antifriction film 2 (see FIGS. 1-3). The metallic layer is applied to one of the two surfaces 3,4 of the carrier material 1. The carrier material 1 consists of a synthetic resin foil. The antifriction film 2 can be applied to the metallic layer 5 or to the surface 3 of the foil opposite the metallic layer 5. If the antifriction film 2 is applied to the surface 3 facing away from the metallic layer 5, it is assumed that, when the foil is coiled into a roll, at least portions of this antifriction film 2 are transferred to a surface 7 of the metallic layer 5 which faces away from the carrier material 1. The metallic layer of one convolution is thereby contacted by that surface 3 of the neighboring convolution which is provided with the antifriction film 2.

The metallic layer 5 can be an aluminum layer which, for example, is vapor deposited on the surface 4 of the carrier material 1. This metallic layer 5 has a surface 6 which is bonded to one of the surfaces 3,4 of the carrier material 1, and a further surface 7 which faces away from the carrier material 1 and presents itself as a metallic surface 7. The metallic surface 7 can be coated with the antifriction film 2. In this case, the antifriction film 2 applied to the metallic layer 5 prevents the metallic layer 5 from being directly subjected to dry friction by an object which loads the metallic layer 5. For example, when a foil has been coiled into a roll, the load-generating object can be a convolution of the roll which exerts mechanical forces on an underlying lower convolution to the degree that the upper convolution is pressed on to the lower convolution. Tensile forces, which arise because the foil has been to tightly wound, are generated in the foil due to pressing of the convolutions against one another. The tight winding creates tension in the carrier material 1 which is equalized over time and thereby causes movements of the individual convolutions relative to neighboring convolutions of the roll. As a result of such movements, the surfaces 3,7 of neighboring convolutions rub against one another so that scratches are created on at least one of the surfaces 3,7. These scratches affect the brilliance of the surfaces 3,7 and reduce the mechanical strength of the metallic layer 5. The latter can develop cracks which extend entirely through the metallic layer 5 and make it permeable, e.g., to gases.

The antifriction film 2 need not only be applied directly to the metallic surface 7 of the metallic layer 5. It is also possible to apply the antifriction film 2 to the surface 3 of the carrier material 1 which faces away from the metallic layer 5. Finally, it is further conceivable to coat both surfaces 3,4 of the carrier material 1 with an antifriction film 2. One of these two antifriction films 2 is additionally provided with a metallic layer 5.

The antifriction film 2 has a uniform thickness over the entire surface 3,7 of the foil. This uniform thickness is as small as possible and should be at most 0.5. The antifriction film 2 can consist of a wax. It is also possible, however, to form the antifriction film 2 as a grease layer.

The surface of the foil which bounds the latter externally is capable of being metallized as well as imprinted. Furthermore, other materials can be coated on the antifriction film 2. The antifriction film 2 will normally be physiologically neutral. Such a form is particularly recommended when the foil is to be suitable for packing purposes.

The carrier material 1 can be produced from a polypropylene, a acetate and a polyethylene. It is further conceivable to use carrier materials 1 consisting of a polyester, a polyamide, a polyvinylchloride or a polystryrene.

The antifriction film 2 possesses good antifriction properties. In particular, it substantially reduces friction relative to a surface covering it. This property is especially useful upon coiling the foil into a roll where an outer convolution slides on an underlying convolution with the aid of the antifriction film 2.

To prevent tearing of the antifriction film 2 away from the surface 3,7 coated with the same, it is made of a material which adheres well to its support. This material is further selected so as to be readily transferable to a surface which is deposited upon the antifriction film 2. However, sufficient amounts of the antifriction film 2 remain on the surface 3,7 originally coated with the same to form a homogeneous antifriction film in cooperation with the transferred portions of the antifriction film. The antifriction film 2 is softer than a material which constitutes the metallic layer 5. Moreover, the material which forms the antifriction film 2 has a low vapor pressure.

The antifriction film 2 is advantageously vapor deposited on the surface 3,7 to be protected. It is also possible, however, to press or spray the antifriction film on. Finally, it is conceivable to uniformly distribute the antifriction film 2 on the foil by means of ultrasound or to carry out the distribution of the material which constitutes the antifriction film electrostatically.

The antifriction film 2 can be applied before the carrier material 1 is coated, e.g., with the metallic layer 5. In this case, the antifriction film 2 is applied to the surface 3 of the carrier material 1 which faces away from the metallic layer 5 to be applied. The antifriction film is at least partially transferred from this surface to the yet to be applied metallic layer 5 when the antifriction film 2 on the surface 3 of the carrier material 1 contacts the metallic layer 5, e.g., upon coiling of the foil into a roll. It is also possible, however, to apply the antifriction film 2 to both surfaces 3,4 of the carrier material 1 before the surface 4 is coated. Coating with an antifriction film, which is carried out prior to metallization of the carrier material 1 as considered in the direction of advance thereof, can be performed in a vapor deposition station where the metallic layer 5 is applied. It is also possible, however, to apply the antifriction film 2 outside of the vapor deposition station in the free atmosphere.

It is further possible to apply the antifriction film 2 to the surface 7 of the metallic layer 5. Such application always takes place in the vapor deposition station before the metallic layer 5 applied in the vapor deposition station is subjected to a mechanical load, e.g., upon deflection by a roller. Finally, it is conceivable to apply the antifriction film 2, also within the vapor deposition station, to the surface 3 of the carrier film 2 which faces away from the metallic layer 5. In this case, the antifriction film 2 is at least partially transferred to the metallic layer 5 when the foil is coiled into a roll. This coiling must, in any event, take place in such a manner that the metallic layer 5 and its metallic surface 7 are not subjected to mechanical loading, e.g., by a deflecting roller, before portions of the antifriction medium have been transferred from the antifriction film 2 to the metallic surface 7 of the metallic layer 5.

As a rule, the metallic layer 5 is vapor deposited. It is also conceivable, however, to produce the metallic layer 5 in another fashion, for example, by adhesion of a metallic layer which was previously detached from a support. Thin metal foils can also be adhesively secured to the antifriction film 2. Advantageously, the metallic layer 5 is produced and immediately thereafter covered with the antifriction film 2. This prevents the newly created metallic layer 5 from being mechanically loaded before the antifriction film 2 has been applied. Application of the antifriction film 2 to the metallic layer 5 here takes place before the foil is deflected by a roller acting on its metallic surface 7.

In an arrangement for the production of the foil (see FIG. 4), the carrier material 1 is unwound from a supply roller 8a. It travels to a vapor deposition station 11 which is composed essentially of a vaporizer 13 heated by an electrical voltage source 12. A container 14, in which a metal 16 vaporizes to form metal vapors 15, is provided in the vaporizer 13. The metal vapors 15 rise towards the carrier material 1, which is deflected by a deflecting roller 17, and are deposited on the carrier material 1 in the form of a metallic layer 5.

The carrier material 1, which is coated with the metallic layer 5, is transported to a take-up roller 8b. On the way, it passes through a coating station including a pick-up roller 21 which projects into a reservoir 22 filled with antifriction material 23. The reservoir 22 is heated by a voltage source 24. The antifriction material 23 is picked up by the pick-up roller 21, wiped with a doctor 36 is necessary, and transferred via a coating roller 19, to the surface 7 of the metallic layer 5 produced in the vapor deposition station 11. The foil which has ben coated with the antifriction film 2 in this manner is wound on to the take-up roller 8b, to form a roll of which one convolution is shown at 9. The thickness of the antifriction film 2 can be set in several ways such as, for example, by adjusting the pressure between the coating roller 19 and a back-up roller 20 so as to correspond to a predetermined thickness of the antifriction film 2. In addition, the speed of advance of the carrier material 1 can be adjusted in such a manner that a desired thickness of the antifriction film 2 is deposited on the surface 3,7 to be coated by the coating roller 19.

Figure 5:
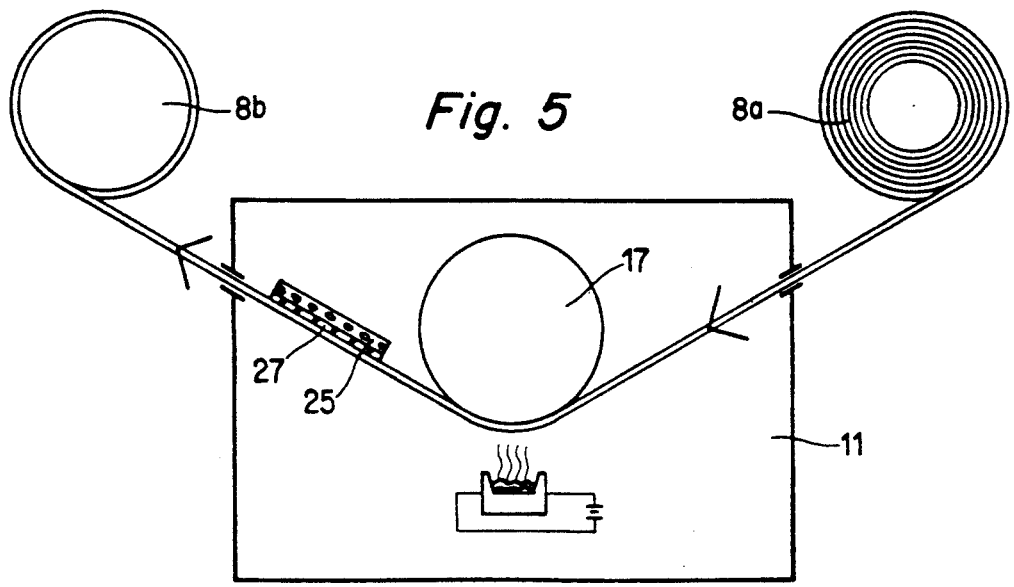
FIG. 5 is a schematic view of another arrangement for coating a foil and vapor depositing an; antifriction film.

The antifriction film also can be applied to the metallic layer 5 or the carrier material 1 by a vapor deposition process. This vapor deposition process takes place in a vapor deposition station 25 (see FIG. 5). In the vapor deposition station 25, the antifriction material is vaporized and transferred to the surface 3,7 to be coated via a nozzle arrangement 27.

Figure 6:
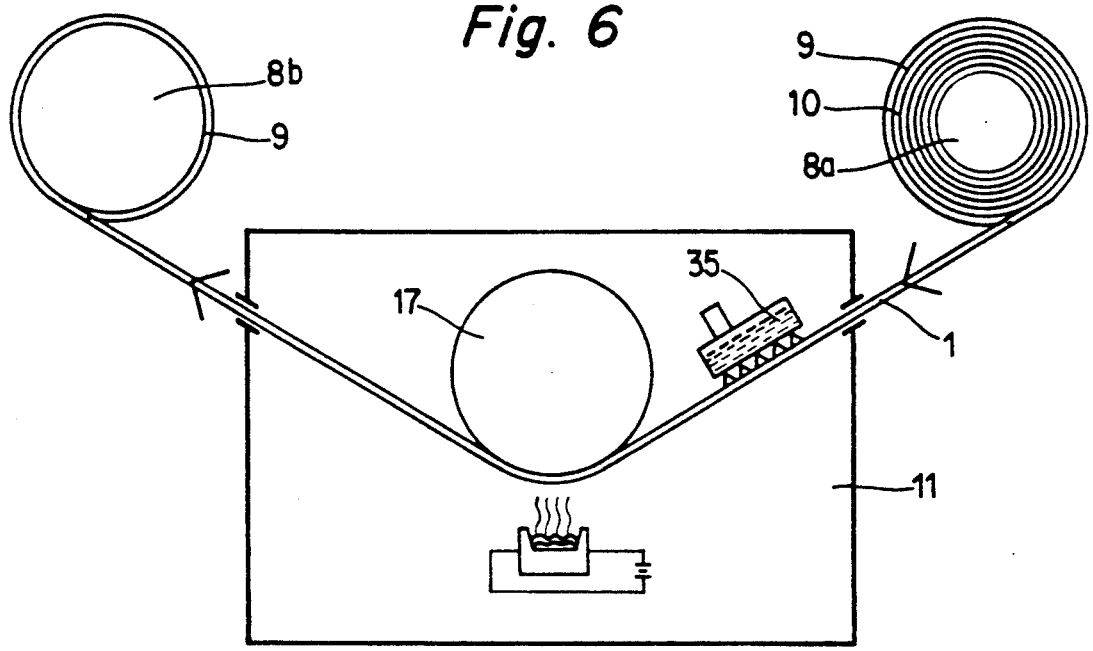
FIG. 6 is a schematic view of an arrangement with which the surface of a foil facing away from the metallic layer to be applied is provided with an antifriction film.

It is further conceivable to spray the antifriction material 23 on to the carrier material 1 in a spraying station 35 (see FIG. 6). The antifriction material 23 is here pressurized and then sprayed on to the surface 3,7 by a nozzle. The spraying station 35 can be located either in front or in back of the vapor deposition station 11 as considered in the direction of advance of the carrier material 1. A spraying station 35 disposed in front of the vapor deposition station 11 can be located either inside or outside of the chamber accommodating the vapor deposition station 11 and must spray at least the surface 3 of the carrier material 1 which faces away from the metallic layer 5 to be applied.

Figure 4:
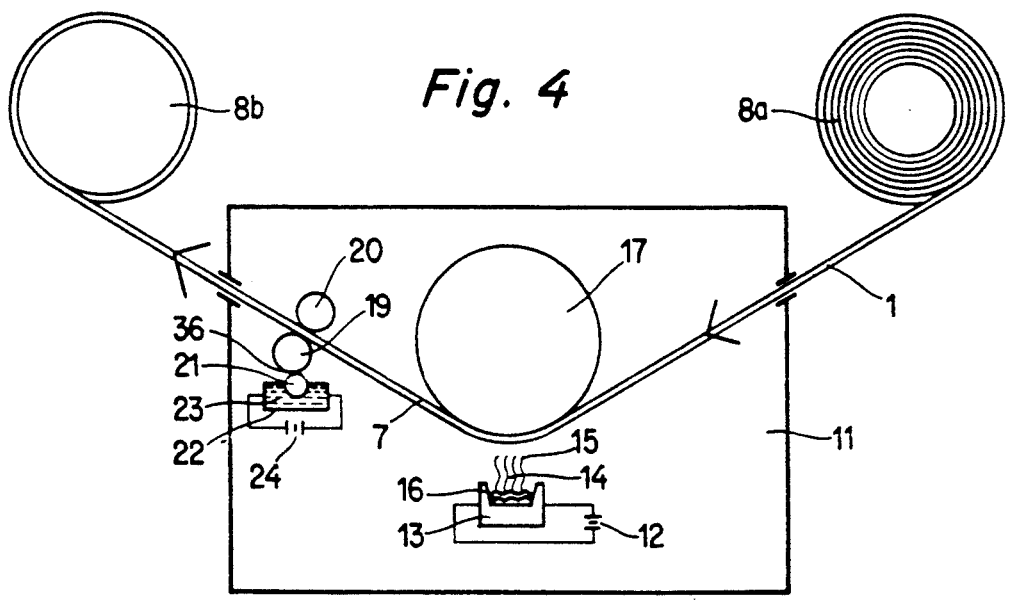
FIG. 4 is a schematic view of an arrangement for coating a foil and applying an antifriction film.
Figure 7:
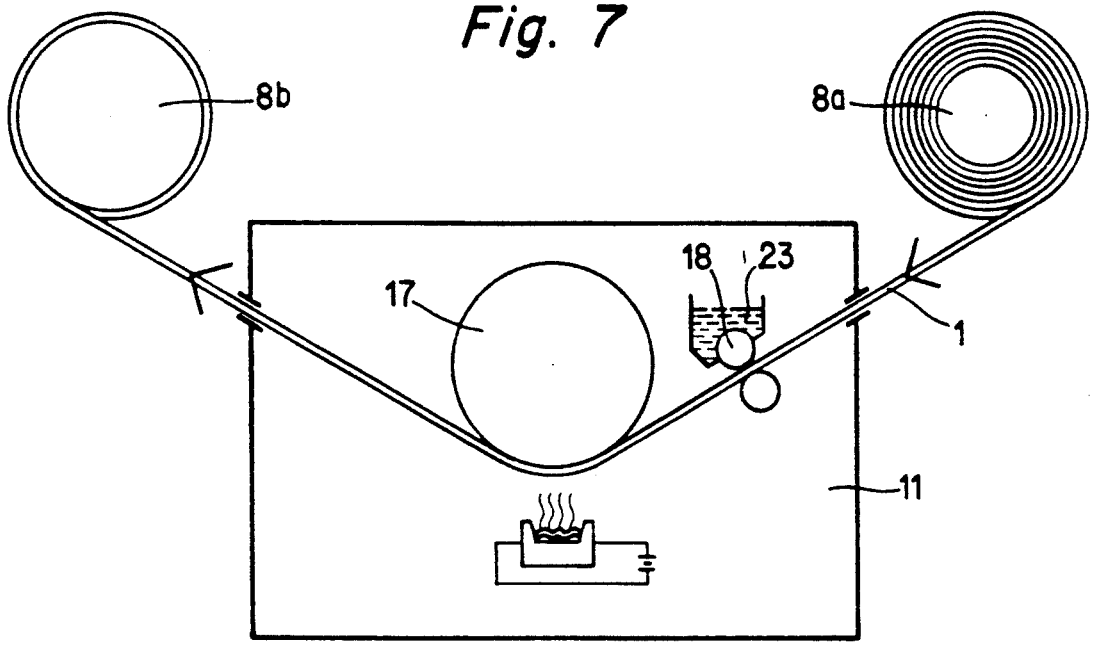
FIG. 7 is a schematic view of an arrangement with which an antifriction film is rolled on to the surface of the foil facing away from the metallic layer to be applied.
Figure 8:
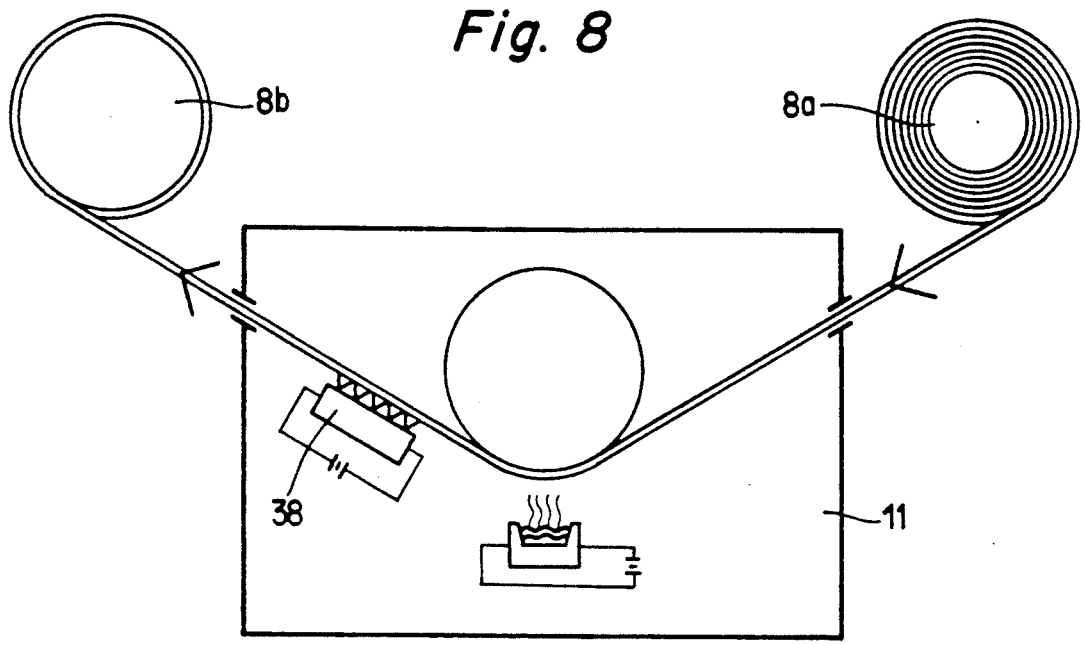
FIG. 8 is a schematic view of an arrangement in which an antifriction film is uniformly distributed by an ultrasound method.
Figure 9:
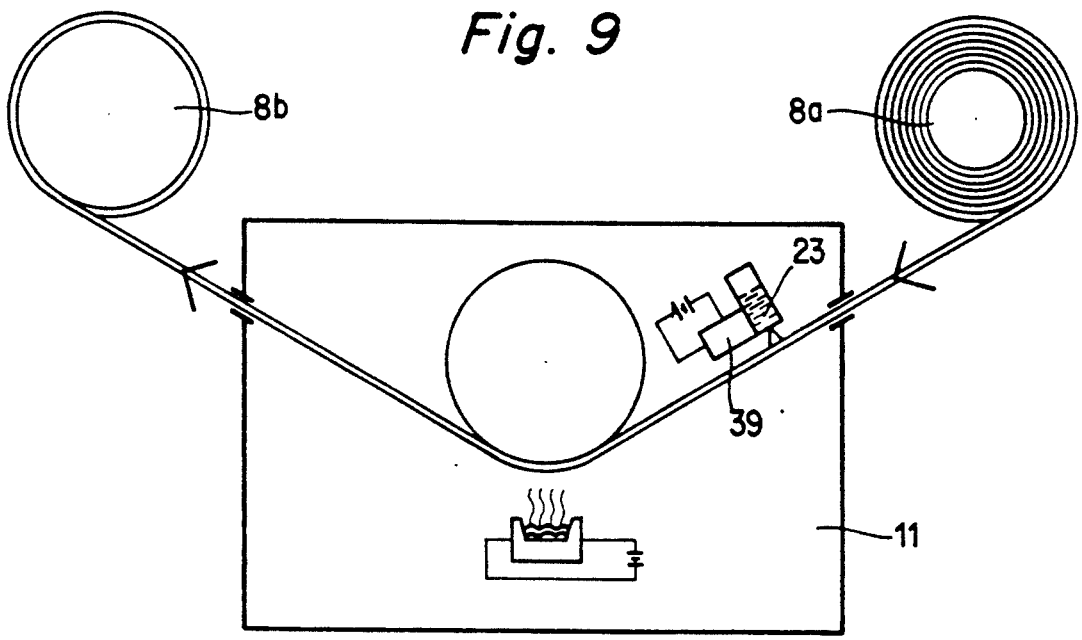
FIG. 9 is a schematic view of a further arrangement in which an antifriction film is uniformly distributed by electrostatic application.

In a similar manner, a coating station 18 (see FIG. 7) for the antifriction material 23 can be located in front of the vapor deposition station 11 rather than in back per FIG. 4, as considered in the direction of advance of the carrier material 1. The vapor deposition station 25 in which the antifriction film 2 is vapor deposited can likewise be arranged in such manner. Finally, it is conceivable to also place an ultrasonic station 38 (see FIG. 8) or a station 39 for the application of an electrostatic charge (see FIG. 9) at one of the locations described above.

It is conceivable to apply portions of the antifriction film 2 to each of the oppositely disposed surfaces 3,7. Such application must be performed so that the portions on one of the two surfaces 3,7 together define an antifriction film 2 which covers the entire surface 3 of the carrier material 1 or the entire surface 7 of the metallic layer 5. Advantageously, the portions are in the form of strips which extend in the longitudinal direction of the carrier material 1. For example, one-half of the surface 3 can be coated with a strip-like antifriction film while a complementary strip-like antifriction film is applied to one-half of the opposite surface 7.

Advantageously, the antifriction material 23 also has an antistatic effect. A lubricant may be used for the antifriction material 23.

The foil is very well suited for a large number of applications since the antifriction film protects the surface 7 so durably that the antifriction film 2 retains its protective function even during processing of the foil. Thus, it is conceivable, for example, to employ the foil as a condenser plate and to wind the same into a condenser. During such winding of the foil, the surface 7 of the metallic layer 5 is not destroyed so that each layer of the foil forms a condenser plate which is resistant to electrical breakdown and is homogeneous over its entire surface. Damage to the surface 7 due to mechanical loads does not occur.

It is further conceivable not to make the metallic layer 5 continuous over a large area and uniform over the entire carrier material 1. Rather, predetermined patterns having either technical or aesthetic functions can be provided in the metallic layer 5 via suitable means. Thus, such patterns can be formed, for example, by the conductors of an electrical circuit. It is precisely for conductors of this type that a uniformly high electrical resistance plays a decisive role. This cannot be permitted to change due, for example, to mechanical damage to the conductors. In order to avoid such damage, the antifriction film is applied to the surface 7 of the metallic layer 5 forming the conductors so that this is not subjected to damage upon areal impingement by a load applied to the conductors. It is conceivable to provide prefabricated conductors with an antifriction film so that they can be areally impinged by objects without such impingement causing destruction of the individual conductors.

Finally, it is also conceivable to apply the antifriction film 2 to at least one surface of a recording tape. In this manner, the emulsion on the recording tape, which serves to preserve electrical signals, is protected.

I claim:

1. A method of making a gas impermeable foil for use in the packaging of goods, comprising the steps of providing a base element including a substrate having two major surfaces; forming a metallic layer on one of said surfaces including vapor depositing a metallic material on said substrate in a vapor deposition station; applying an antifriction film to said layer in the vapor deposition station, including coating the entire layer with an antifriction medium having a thickness of not less than 0.45 u; advancing said substrate along a predetermined path during said forming and applying steps which are carried out at first and second locations of said path, respectively; deflecting said substrate at a third location of said path downstream of said first and second locations; and shielding said layer from damage affecting its impermeability of gases prior to the application of said film thereto.

2. The method of claim 1, further comprising the step of coating at least a part of the other of said surfaces with an antifriction medium, and coiling said substrate subsequent to said coating step.

3. The method of claim 1, wherein the applying step includes vapor depositing an antifriction medium on said substrate.

4. The method of claim 1, wherein said layer has an exposed surface prior to the applying step; said shielding comprising maintaining said exposed surface out of contact with objects between the forming and applying steps.

5. The method of claim 1, further comprising coiling said substrate with said layer and said film downstream of said vapor deposition station.

6. The method of claim 1, wherein the applying step is performed in its entirety subsequent to the forming step.

7. The method of claim 1, further comprising the step of coating at least a portion of the other of said surfaces with an antifriction medium.

* * * * *